(12) United States Patent
Hwang

(10) Patent No.: US 7,781,032 B2
(45) Date of Patent: Aug. 24, 2010

(54) METHOD FOR DEPOSITING A THIN FILM

(75) Inventor: Woo-Yeon Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 591 days.

(21) Appl. No.: 11/703,175

(22) Filed: Feb. 7, 2007

(65) Prior Publication Data

US 2007/0184210 A1 Aug. 9, 2007

(30) Foreign Application Priority Data

Feb. 9, 2006 (KR) ...................... 10-2006-0012714

(51) Int. Cl.
*H05H 1/24* (2006.01)
(52) U.S. Cl. ...................... 427/569; 427/248.1; 117/84; 117/108
(58) Field of Classification Search ................. 427/569, 427/248.1; 117/84, 108
See application file for complete search history.

(56) References Cited

U.S. PATENT DOCUMENTS

| | | | |
|---|---|---|---|
| 4,920,012 A * | 4/1990 | Woodruff et al. ............ 428/634 |
| 5,020,474 A * | 6/1991 | Tanaka ........................ 118/725 |
| 5,138,628 A * | 8/1992 | Pocholle et al. ................ 372/99 |
| 5,217,560 A | 6/1993 | Kurono et al. |
| 5,383,984 A | 1/1995 | Shimada et al. |
| 5,683,518 A * | 11/1997 | Moore et al. ................. 118/730 |
| 6,074,486 A | 6/2000 | Yang et al. |
| 6,224,950 B1 * | 5/2001 | Hirata ........................ 427/535 |
| 6,429,152 B1 | 8/2002 | Yang et al. |
| 6,482,747 B1 | 11/2002 | Takahashi et al. |
| 6,486,083 B1 | 11/2002 | Mizuno et al. |
| 6,599,361 B2 * | 7/2003 | Tang et al. .................... 117/84 |
| 6,624,950 B2 * | 9/2003 | Hirata et al. ................. 359/649 |
| 6,680,130 B2 * | 1/2004 | Manchanda et al. ......... 428/689 |
| 2002/0007796 A1 * | 1/2002 | Gorokhovsky ........ 118/723 ER |
| 2007/0137572 A1 * | 6/2007 | Matsuura et al. ......... 118/723 E |
| 2009/0133622 A1 * | 5/2009 | Huang et al. ................. 118/663 |

FOREIGN PATENT DOCUMENTS

| JP | 61-015976 | 1/1986 |
|---|---|---|
| JP | 5-295526 | * 11/1993 |
| JP | 06-037056 | 2/1994 |
| JP | 11-243077 | 9/1999 |
| JP | 2001-230248 | 8/2001 |

(Continued)

OTHER PUBLICATIONS

Gupta, B.K., et al., "The conductivity of a weakly ionised flowing plasma in crossed electric and magnetic fields". J. Phys. D: Appl. Phys., vol. 11, 1978, pp. 2242-2248.*

*Primary Examiner*—Bret Chen
(74) *Attorney, Agent, or Firm*—Lee & Morse, P.C.

(57) ABSTRACT

A method of depositing a thin film may include providing a wafer into a thin film apparatus, rotating the wafer, flowing a plasma across the wafer from edge to edge, depositing a first thin film on the wafer, creating a temperature gradient within the thin apparatus, and depositing a second thin film on the wafer. The temperature gradient may include having the temperature at the center of the wafer being higher than the temperature at the edges of the wafer.

12 Claims, 6 Drawing Sheets

FOREIGN PATENT DOCUMENTS

| | | |
|---|---|---|
| KR | 10-1999-002661 | 1/1999 |
| KR | 10-0252213 B | 1/2000 |
| KR | 10-2004-0013247 | 2/2004 |
| KR | 10-2005-0042462 | 5/2005 |
| KR | 10-2005-0089237 | 9/2005 |

* cited by examiner

METHOD FOR DEPOSITING A THIN FILM

BACKGROUND OF THE INVENTION

1. Field of the Invention

The present invention disclosed herein relates to a method and apparatus for depositing a thin film, and more particularly, to an apparatus and method for forming a planar thin film using a plasma and ramping-down deposition processes.

2. Description of the Related Art

Chemical vapor deposition (CVD) is generally used to deposit a thin film on a wafer. An apparatus for forming the thin film on the wafer using the CVD process may be a single-type apparatus for processing a single wafer or a batch-type apparatus for simultaneously processing multiple wafers. An example of a batch-type apparatus is a CVD apparatus having a vertical tube type reaction furnace, which may include a reaction furnace having an outer tube and an inner tube. A boat disposed in the reaction furnace may receive a plurality of wafers. A heater may disposed outside of the reaction furnace. Gas required for the CVD process may be supplied from a nozzle and exhausted through an exhaust portion.

The concentration of the gas may be reduced with distance from the nozzle. This may result in the uneven layering of the thin films on the wafers. Furthermore, since the gas flow must enter the stack of wafers, the gas concentration, and resulting thin film layers, may be uneven between the edge and center of the wafers.

When an insulating thin film layer, e.g., a nitride layer, is deposited on a wafer using the described CVD apparatus, the insulating thin film layer may be uneven due to non-uniform reaction gas concentration. That is, the density and thickness of the insulating thin film layer may be uneven between the edge and center of the wafer. If the insulation layer is thick at the edge and thin at the center, the breakdown voltage (BV) at the edge of the wafer W will be greater than the BV at the center of the wafer. This may compromise electrical properties of the semiconductor and reduce yields.

SUMMARY OF THE INVENTION

The present invention is therefore directed to a thin film deposition apparatus and method depositing a thin film, which substantially overcomes one or more of the problems due to the limitations and disadvantages of the related art.

It is therefore a feature of an embodiment of the present invention to provide a thin film depositing apparatus, and a method of depositing a thin film that provides a thin film of uniform thickness.

Embodiments of the present invention provide apparatuses for depositing a thin film which may include a vertical tube to provide a space in which a thin film deposition process may be performed, a plasma generator in the vertical tube, a heater disposed adjacent to the vertical tube, and a boat rotatably disposed in the vertical tube.

In some embodiments, the plasma generator may include first and second vertical electrodes for generating a plasma therebetween, the first vertical electrode receiving electrical power and the second vertical electrode being grounded; a power source for applying electrical power to the first electrode; and a plasma injector providing a plurality of injection holes through which the plasma generated between the first and second vertical electrodes is supplied to the vertical tube.

In other embodiments, the thin film forming apparatus may further include a gas supply unit to supply gas to the plasma generator.

In still other embodiments, the vertical tube may include an inner chamber providing an enclosed space where the plasma generator may be disposed, and in which the thin film deposition process may be performed; and an outer chamber for receiving the inner chamber and the heater.

In other embodiments, the thin film forming apparatus may include a loadlock chamber disposed under the vertical tube to temporarily hold a wafer.

In other embodiments, the boat may be vertically movable between the loadlock chamber and the vertical tube. The apparatus may further include a first driving unit that may be combined with a lower portion of the loadlock to move the boat vertically, and a second driving unit that may be combined with an upper portion of the vertical tube to rotate the boat.

In another embodiment, the thin film forming apparatus may further include a lift cylinder disposed at a lower portion of the loadlock chamber to move the boat vertically, and a motor disposed at an upper portion of the outer chamber to rotate the boat. The motor may rotate the boat while the thin film deposition process is being performed.

In other embodiments, a first vertical electrode may receive electrical power from a power source and a second vertical electrode may be grounded.

The thin film forming apparatus may further include a slot valve disposed to be capable of sliding between the vertical tube and the loadlock chamber to isolate the vertical tube from the loadlock chamber.

The thin film forming apparatus may further include a gate valve disposed at a side of the loadlock chamber to open and close the loadlock chamber.

In still other embodiments of the present invention, a method of depositing a thin film may include providing a wafer into a thin film forming apparatus; rotating the wafer; flowing a thin film plasma from a first edge of the wafer to a second edge of the wafer via a center of the wafer; depositing a first thin film on the wafer; creating a temperature gradient within the thin film apparatus, wherein the temperature at the center of the wafer is higher than the temperature at the edges of the wafer; and depositing a second thin film on the wafer.

In some embodiments, in the depositing of the first thin film, the first thin film at the center of the wafer is thinner than the first thin film at the edges of the wafer. In the flowing of the thin film plasma, a plasma concentration at the edges of the wafer is greater than a plasma concentration at the center of the wafer.

In other embodiments, in the depositing of the second thin film, the second thin film at the center of the wafer is thicker than the second thin film which is deposited at the edges of the wafer. Plasma generation may be stopped while the second thin film is deposited. The temperature within the apparatus may be lowered during the second thin film deposition. The depositing of the second thin film and the depositing of the first thin film may be performed in situ.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 2006-12714, filed on Feb. 9, 2006, in the Korean Intellectual Property Office, and entitled: "Apparatus and Method for Depositing Thin Film," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
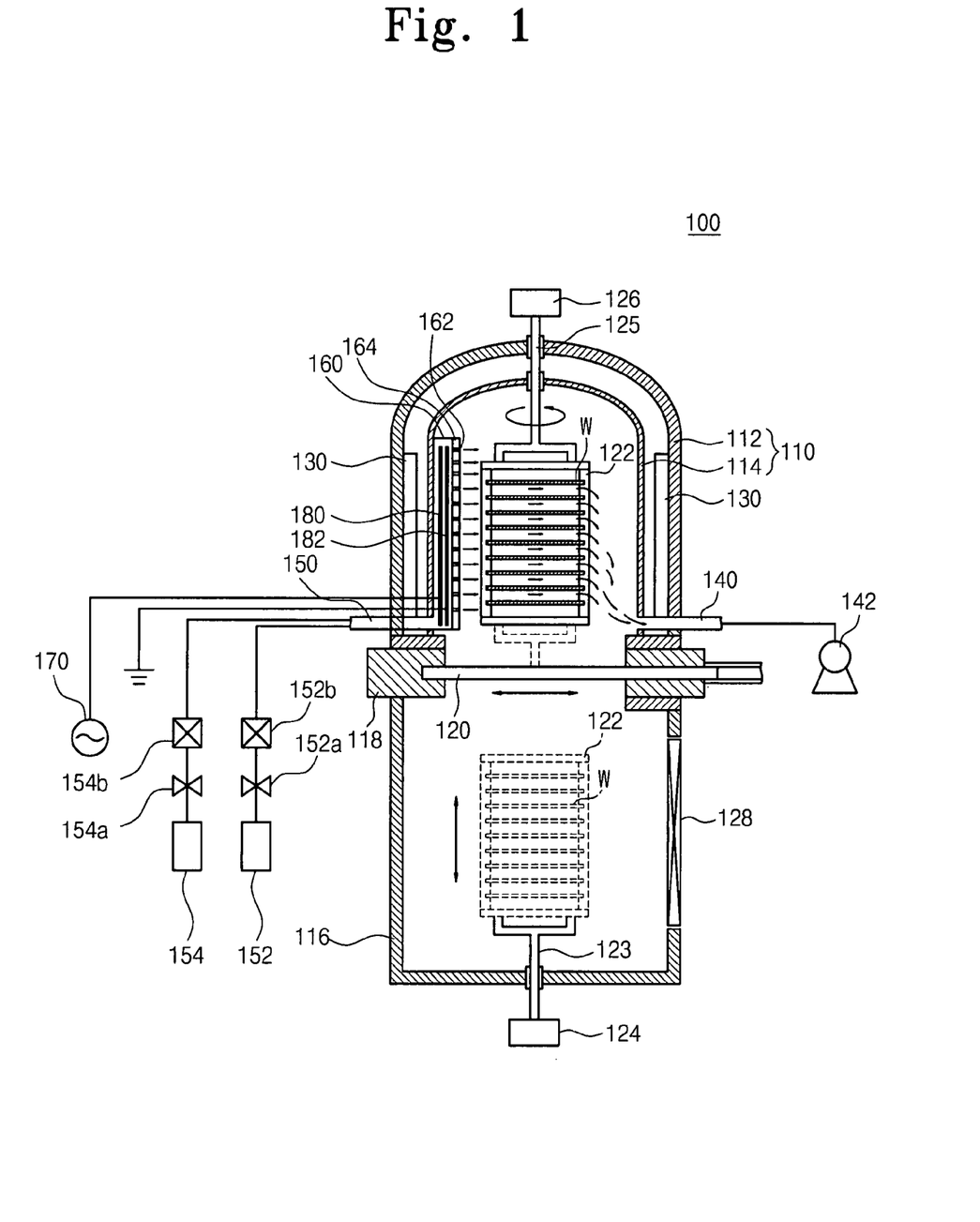
FIG. 1 illustrates a sectional view of a thin film deposition apparatus according to an embodiment of the present invention.

FIG. 1 illustrates a sectional view of a thin film deposition apparatus according to an embodiment of the present invention. Referring to FIG. 1, a thin film deposition apparatus 100 of this embodiment may be a batch type plasma deposition apparatus that can simultaneously deposit thin films on a plurality of wafers W using plasma. The batch type plasma deposition apparatus 100 may include a vertical tube 110 to provide an enclosed space in which the deposition process for simultaneously depositing thin films on the wafers W is performed.

The vertical tube 110 may include an inner chamber 114 and an outer chamber 112. The outer chamber 112 may enclose the inner chamber 114 and one or more heaters 130 between the outer chamber 112 and the inner chamber 114.

A loadlock chamber 116 may be disposed under the vertical tube 110. The vertical tube 110 and the loadlock chamber 116 may be interconnected by a flange 118. The loadlock chamber 116 may temporarily store the wafer W that is processed in the vertical tube 110. That is, the wafer W to be loaded in the vertical tube 110 may be staged in the loadlock chamber 116. The wafer W may enter or exit the loadlock chamber 116 through a gate valve 128 provided at a sidewall of the loadlock chamber 116. The vertical tube 110 and the loadlock chamber 116 may be separated from each other by a slot valve 120, e.g., a sliding barrier.

The boat 122 receiving the wafers W may be movably disposed between an inner chamber 114 of the vertical tube 110 and the loadlock chamber 116. The boat 122 may move between the inner chamber 114 and the loadlock chamber 116 by a driving unit 124, e.g., a lift cylinder, that provides vertical driving power. Here, the driving unit 124 may be disposed below the loadlock chamber 116. The connection unit 123 may be attached between the boat 122 and the driving unit 124 to transfer the vertical driving power of the driving unit 124 to the boat 122. In addition, the boat 122 may be rotated in the inner chamber 114 by a driving unit 126, e.g., a motor. The driving unit 126 may be disposed above the vertical tube 110. The connection unit 125 may attach the boat 122 to the driving unit 126 to transfer the rotation power of the driving unit 126 to the boat 122.

A plasma generator 160 may be provided in the inner chamber 114 to generate the plasma that is required for the deposition process. The plasma generator 160 may include two electrodes 180 and 182 to receive the power required to generate the plasma. The electrode 180 may receive electrical power from a power source 170, while the electrode 182 may be grounded.

The gas required to generate the plasma may be supplied from gas supply units 152 and 154. The flow of the gas supplied from the gas supply units 152, 154 to the plasma generator 160 may be controlled by valves 152a, 154a. The flow rate of the gas may be detected by flow meters 152b, 154b. The gas supplied from gas supply units 152, 154 may be directed into the plasma generator 160 through a gas supply pipe 150. The gas supply pipe 150 may be disposed at a lower portion of the vertical tube 110. An injector 164 may be provided beside the plasma generator 160. The injector 164 may include a plurality of injection holes 162 to distribute the plasma.

An exhaust pipe 140 may be provided at a lower portion of the inner chamber 114. The exhaust pipe 140 may be connected to the pump 142. The pump 142 may control the pressure of the inner chamber 114 and may exhaust gas out of the inner chamber 114. Therefore, while the plasma process treatment, e.g., deposition process, is being performed in the inner chamber 114, gas, e.g., plasma, may be exhausted from the inner chamber 114 by the operation of the pump 142.

The wafer W to undergo a deposition process may be first received through the gate valve 128 and into the boat 122 disposed in the loadlock chamber 116. When the slot valve 120 is opened, the connection unit 123 may transmit the driving power from the driving unit 124 to the boat 122 to move the boat 122 from the loadlock chamber 116 to the inner chamber 114. The boat 122 may then be held by the connection unit 125 while the slot valve 120 closes to seal the inner chamber 114.

Gas may be supplied from the gas supply units 152 and 154 to the plasma generator 160. The gas may be introduced between the electrodes 180 and 182 inside the plasma generator 160. Electrical power may be applied from the power source 170 to generate plasma between the electrodes 180 and 182. The generated plasma may be supplied to the wafer W through the injection holes 162 in the injector 164 to perform the deposition process. At this point, the heater 130 may provide the heat required for the thin film process in the inner chamber 114 while the driving unit 126 rotates the boat 122 and wafer W. In addition, the pump 142 may operate during the deposition process so that the plasma is taken into the exhaust pipe 140 and exhausted.

During the deposition process, the plasma (see arrows) generated in the plasma generator 160 may be directed to the surface of the wafer W through the injection holes 162 where it then may flow toward the exhaust portion 140. That is, the plasma may flow from one side edge to the other side edge of the wafer W, passing across the center of the wafer W.

Figure 2A:
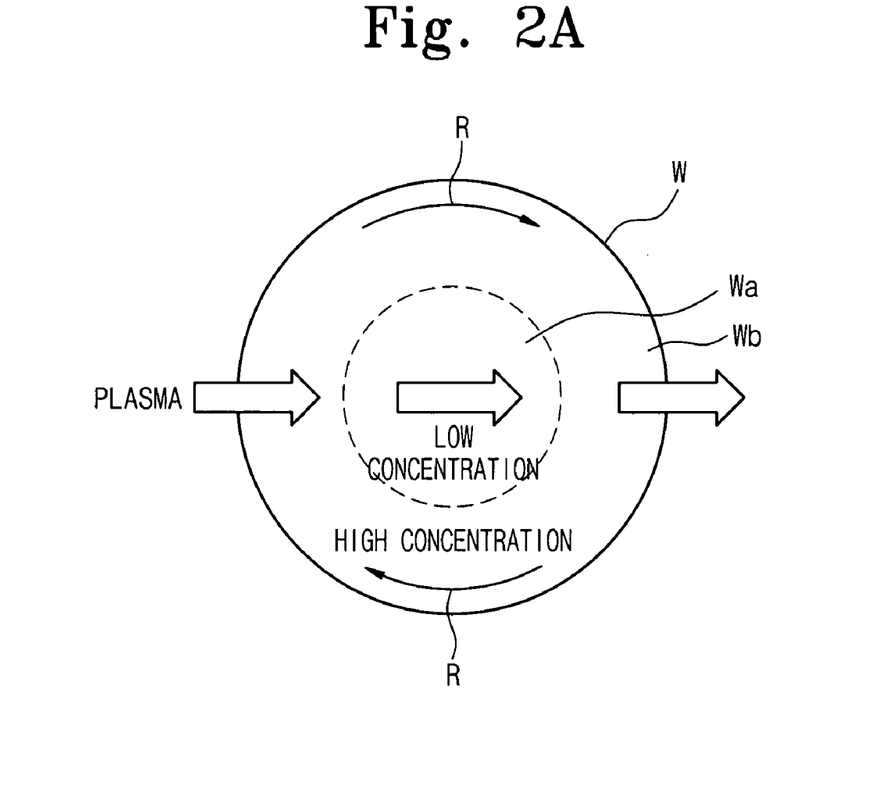
FIG. 2A illustrates a top view of a plasma flow in a thin film deposition method according to an embodiment of the present invention.
Figure 2B:
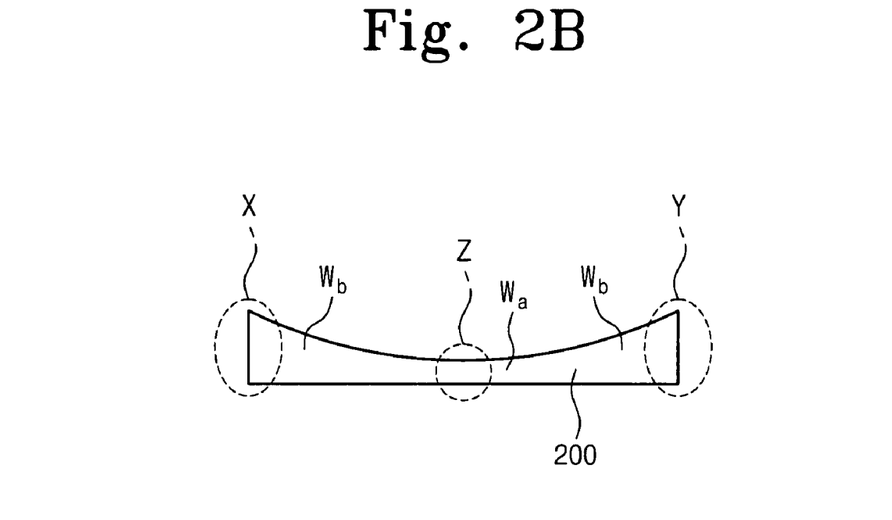
FIG. 2B illustrates a sectional view of an uneven thickness of a first thin film from the plasma flow of FIG. 2A which is caused by a plasma concentration difference in a thin film deposition method.

FIG. 2A illustrates a top view of a plasma flow across a wafer W in a thin film deposition method according to an embodiment of the present invention. FIG. 2B illustrates a sectional view of an uneven thin film thickness, which is caused by a plasma concentration difference in a thin film deposition method.

Referring to FIG. 2A, as described above, the plasma may flow from a left edge of the wafer W to a right edge of the wafer W. Therefore, the concentration of the plasma at the left edge may be relatively high when compared to the plasma concentration at the right edge. In addition, when the wafer W rotates, as indicated by R, the concentration of the plasma at the edge Wb of the wafer W may be relatively high compared with the plasma concentration at the center Wa of the wafer W. Therefore, as illustrated in FIG. 2B, the thickness of the thin film 200 at portions X and Y deposited on the edge Wb of the wafer W may be greater than the thin film deposited at a portion Z near the center Wa of the wafer W. The uneven thin film thickness illustrated may become more exaggerated as the diameter of the wafer W increases. Therefore, after the thin film 200 is deposited, the portion Z of the thin film 200, which is relatively thin, may be supplemented by the process described below.

Figure 3A:
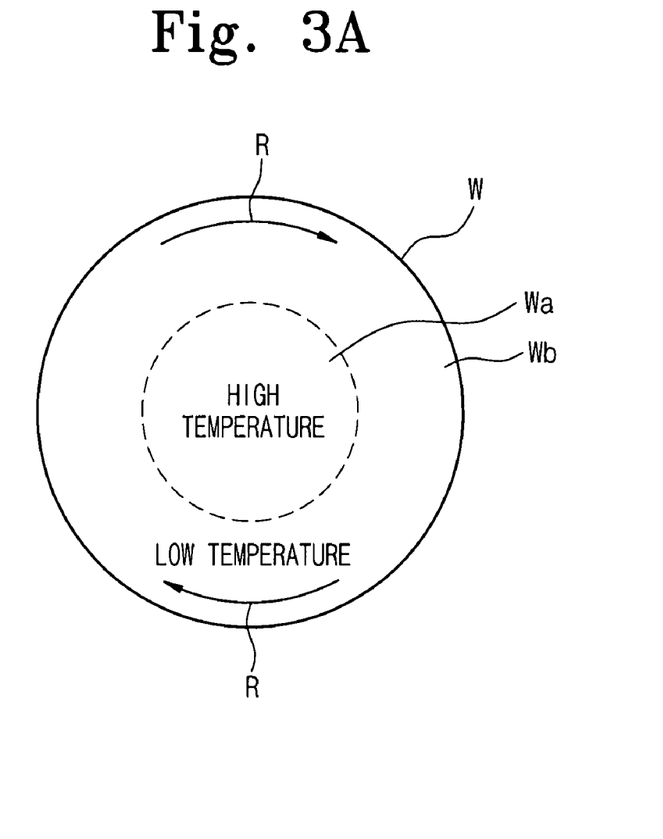
FIG. 3A illustrates a top view of uneven wafer temperature in a thin film deposition method according to an embodiment of the present invention.
Figure 3B:
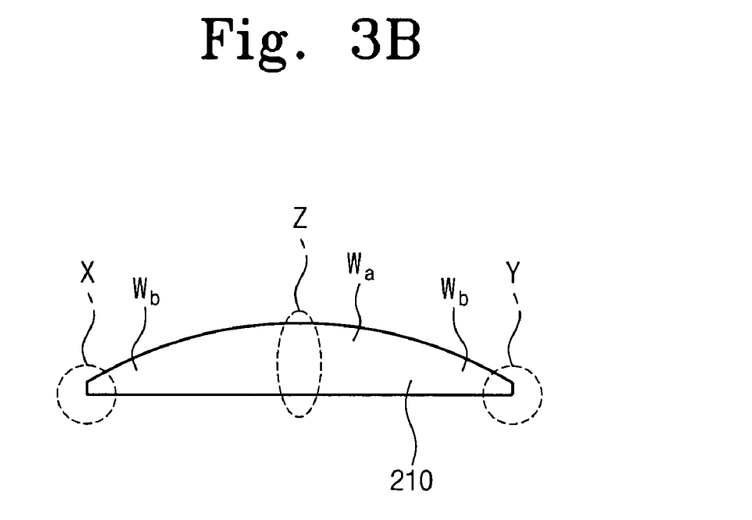
FIG. 3B illustrates a sectional view of an uneven thin film thickness caused by temperature variations in a thin film deposition method according to an embodiment of the present invention.

FIG. 3A illustrates a top view of an uneven temperature distribution of a wafer in a thin film deposition method according to an embodiment of the present invention. FIG. 3B illustrates a sectional view of an uneven thin film thickness caused by temperature variations in a thin film deposition method according to an embodiment of the present invention.

Referring to FIG. 3A, the temperature within the apparatus 100 may be manipulated so that the edge Wb of the wafer W may have a temperature lower than the center Wa of the wafer W. The deposition process may require heat within a particular range, depending upon the materials to be deposited. Thus, manipulation of the temperature within the apparatus 100 may affect the deposition of the thin film layers. FIG. 1 illustrates that the heater 130 may be disposed at the periphery of the inner chamber 114. Thus, when the heater 130 is operated, the edge Wb of the wafer W may have a higher temperature than the center Wa of the wafer W. However, when the temperature is lowered, the temperature of the edge Wb of the wafer W may be lowered more quickly than the center Wa of the wafer W. Therefore, the thin film 210 may be deposited using this ramping down deposition phenomenon. In accordance with this phenomenon, the thickness of the portion Z of the thin film 210 deposited on the center Wa of the wafer W may be greater than the thickness of portions X and Y deposited on the edge Wa of the wafer W. That is, the thin film process illustrated in FIGS. 3A and 3B may supplement the process illustrated in FIGS. 2A and 2B. When the ramping down deposition (RDD) process is used, the power applied to the heater 130 may be reduced or turned off.

Figure 4A:
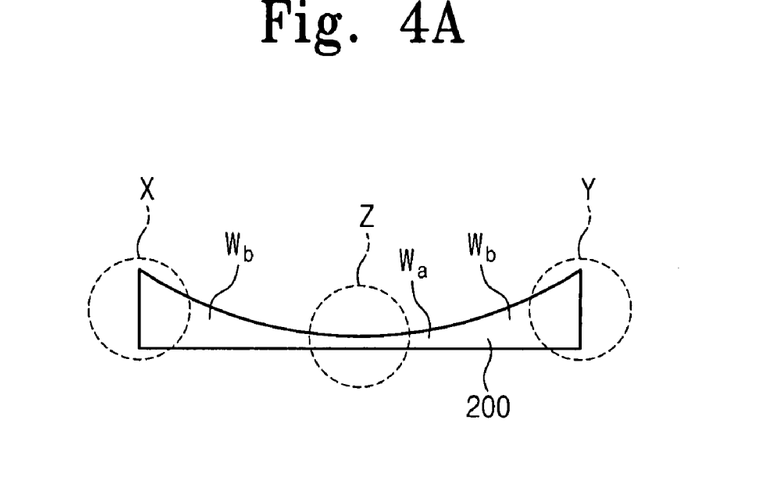
FIGS. 4A-4B illustrate sectional and top views of the deposition processes of FIGS. 2A-2B according to an embodiment of the present invention.
Figure 4B:
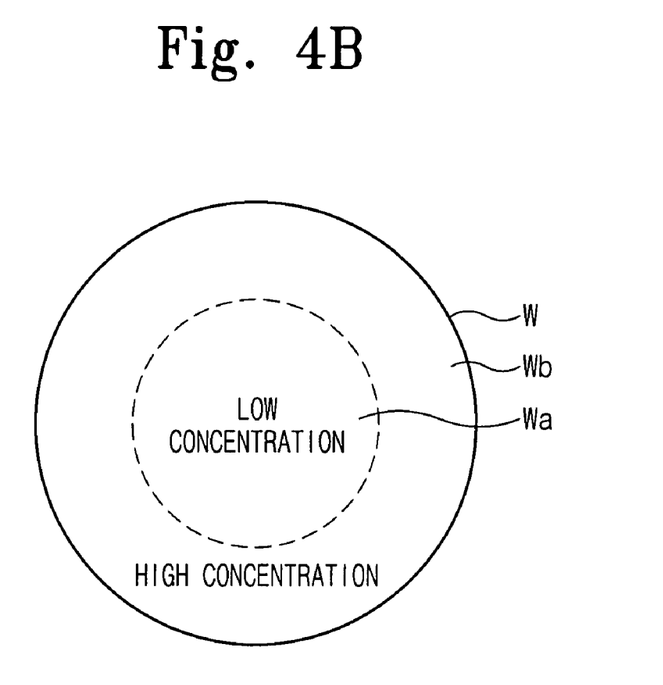
Figure 4C:
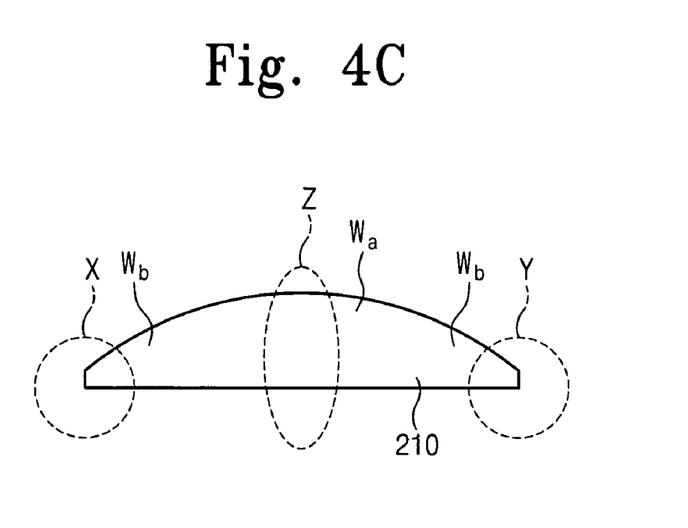
FIGS. 4C-4D illustrate sectional and top views of the deposition processes of FIGS. 3A-3B according to an embodiment of the present invention.
Figure 4D:
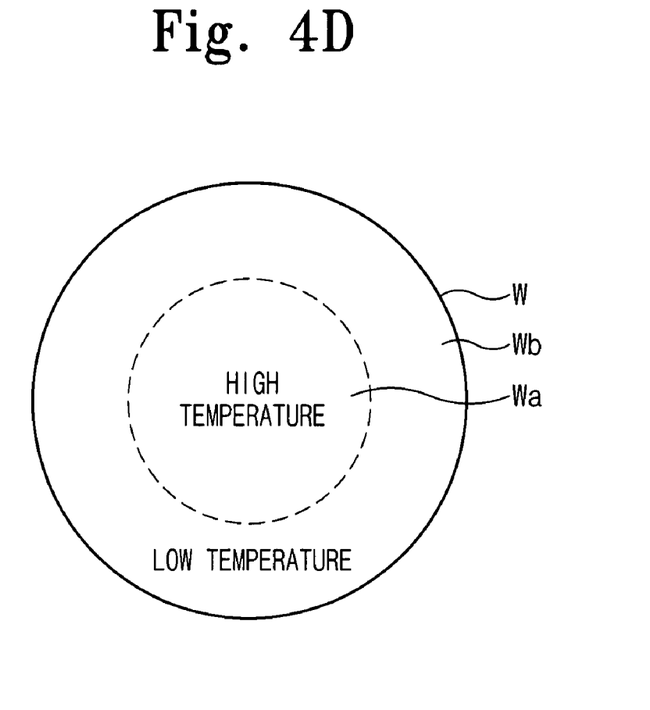
Figure 4E:
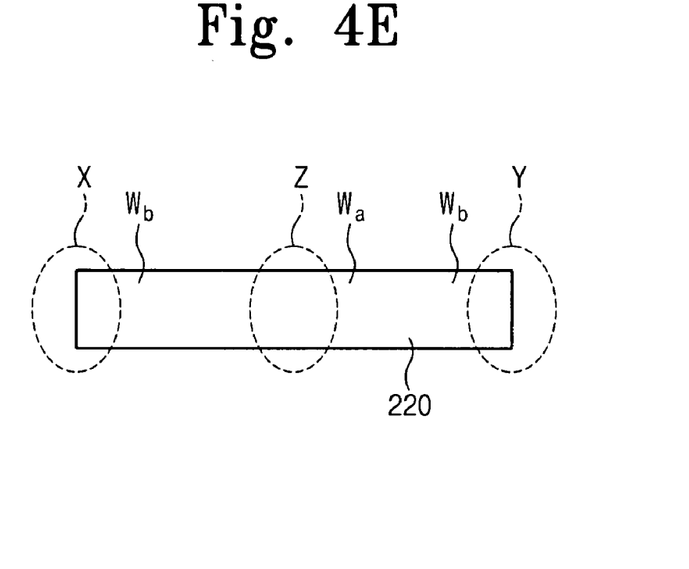
FIGS. 4E-4F illustrate sectional and top views of a final deposition resulting from the processes of FIGS. 2A through 3B according to an embodiment of the present invention.
Figure 4F:
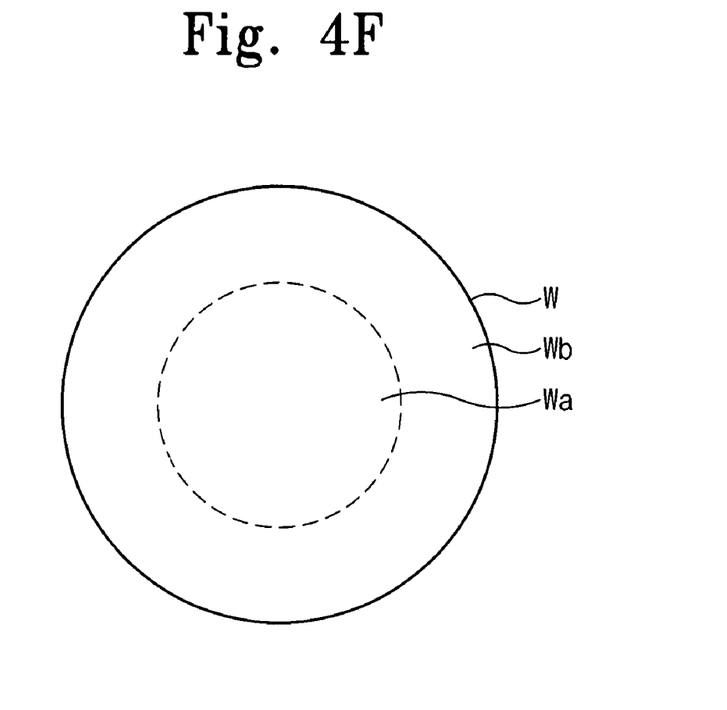

FIGS. 4A through 4F illustrate the deposition processes of FIGS. 2A through 3B and a final deposition result according to an embodiment of the present invention. FIGS. 4A-4B illustrate the deposition process of FIGS. 2A and 2B, FIGS. 4C-4D illustrate the deposition process of FIGS. 3A and 3B, and FIGS. 4E-4F illustrate a final deposition resulting from the processes of FIGS. 2A through 3B. In FIGS. 4A, 4C and 4E illustrate top views of the wafer W. FIGS. 4B, 4D and 4F illustrate sectional views of the thin film.

Referring to FIGS. 4A-4B, the temperature within the apparatus 100 may be uniform, but the plasma concentration at the edge Wb of the wafer W may be greater than the plasma concentration at the center Wa of the wafer W, and thus the thickness of the thin film 200 at portions X and Y may be greater than that of the portion Z. As shown in FIGS. 4C-4D, using the ramping down deposition process, the wafer center Wa may be at a relatively high temperature while the wafer edge Wb may be at a relatively low temperature, so that the portion Z may be deposited more thickly than portions X and Y.

FIGS. 4E-4F illustrate a thin film deposition process where the ramping down deposition process of FIGS. 4C-4D may be used after the process illustrated in FIGS. 4A-4B. In the two-step process, the first thin film 200 deposited may be quite thin at portion Z. However, during the ramping down deposition process, the second thin film 200 deposited may supplement the thickness of the first thin film layer at portion Z, thereby making a single, planar thin film 220. If the planar thin film 220 is an insulation layer, the insulation properties of the insulation layer may be uniform throughout the entire surface of the wafer W, and thus the breakdown voltage BV variations may be improved.

The described two-step thin film deposition method may be applied to a plasma nitridation (PN) formation process, an atomic layer deposition process or other CVD processes. This is described below. The PN process may include a nitrite-treatment in-situ after phosphorous P is deposited on a polysilicon layer. The PN process may be used to enlarge the surface area of a capacitor electrode. In order to increase the capacity of the capacitor, a hemispherical grain (HSG) may be formed on the surface of the capacitor electrode. The concentration of the HSG may increase as the concentration of the phosphorous P contained in the polysilicon decreases. Therefore, the PN process, including plasma $PH_3$ doping and rapid thermal nitridation (RTN) processes, may be performed before the capacitor dielectric layer is formed, in order to compensate for the low phosphorous concentration of the polysilicon.

The PN process may be performed by the above-described batch type plasma deposition apparatus 100. In this example, a plasma RTN process may be performed to provide a nitride layer. As illustrated in FIG. 4A, when the nitride layer is deposited on the wafer W through the plasma RTN process, the thickness of the portion Z deposited on the wafer center Wa may be less than that the nitride layer of the portions X and Y deposited on the wafer edge Wb. This is described above with reference to FIGS. 2A and 2B. That is, the nitride layer deposition at the wafer edge Wb, where the concentration of the plasma is relatively high, may be quicker than at the wafer center Wa, where the plasma concentration is relatively low. Although the plasma RTN process has a relatively high deposition speed, it may result in an uneven nitride layer thickness between the wafer center Wa and the wafer edge Wb. The uneven nitride layer may be compensated for by implementing the ramping down deposition process as the next step. The ramping down deposition and the plasma RTN process may be performed in situ.

The ramping down deposition process may be performed while lowering the temperature of the heater 130 or turning the heater 130 off. Plasma may not be generated during the ramping down deposition process. As illustrated in FIGS. 4C-4D, the thin layer deposition at portion Z on the wafer center Wa is thicker than the thin film of the portions X and Y due to the higher temperature of the wafer center Wa. FIG. 4E illustrates that there may be no step or irregularity between the thin layer portion Z deposited on the wafer center Wa and the thin layer portions X, Y deposited on the wafer edge Wb. Thus, the planar thin film 220, e.g., a planar nitride layer, may be formed.

According to the present invention, an uneven thin film may be quickly formed using plasma. The uneven portions of the thin film may be compensated for via a second thin film applied using a ramping down deposition process, thereby providing a planar thin film. When an insulating thin film layer is formed, the thin film may have excellent electrical properties when compared to conventional CVD. The present invention improves the electrical properties and the yield of the semiconductor device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of depositing a thin film, comprising:
    providing a wafer into a chamber of a thin film apparatus;
    rotating the wafer;
    depositing a first thin film on the wafer by flowing a thin film plasma from a first edge of the wafer to a second edge of the wafer via a center of the wafer, and after depositing the first thin film, the first thin film at the center of the wafer being thinner than the first thin film at the edges of the wafer;
    creating a temperature gradient within the thin film apparatus, wherein a temperature at the center of the wafer is higher than a temperature at the edges of the wafer; and
    depositing a second thin film on the wafer, and after depositing the second thin film, the second thin film at the center of the wafer being thicker than the second thin film which is deposited at the edges of the wafer,
    wherein the first thin film and the second thin film together form a planar thin film having approximately a same thickness at the center of the wafer and at the edges of the wafer.

2. The method as claimed in claim 1, wherein, during flowing of the thin film plasma, a plasma concentration at the edges of the wafer is greater than a plasma concentration at the center of the wafer.

3. The method as claimed in claim 1, further comprising stopping plasma generation during the depositing of the second thin film.

4. The method as claimed in claim 1, further comprising lowering a temperature of the chamber during the depositing of the second thin film.

5. The method as claimed in claim 1, wherein depositing the second thin film and depositing the first thin film are performed in situ.

6. The method as claimed in claim 1, wherein the temperature gradient is created after deposition of the first thin film on the wafer.

7. The method as claimed in claim 1, further comprising:
    providing a boat capable of rotating the wafer; and
    providing a heater capable of creating the temperature gradient.

8. The method as claimed in claim 1, further comprising providing a plasma generator capable of generating the thin film plasma.

9. The method as claimed in claim 8, wherein, during depositing of the first thin film on the wafer, the plasma generator directs the thin film plasma toward the wafer.

10. The method as claimed in claim 1, wherein the method is applied to a plasma nitridation (PN) formation process.

11. The method as claimed in claim 1, wherein the method is applied to an atomic layer deposition process.

12. The method as claimed in claim 1, wherein the method is applied to a chemical vapor deposition process.

* * * * *